(12) United States Patent
Fuhrman

(10) Patent No.: US 6,384,760 B1
(45) Date of Patent: May 7, 2002

(54) ANALOG-TO-DIGITAL CONVERTER

(75) Inventor: Philip B. Fuhrman, Wilmington, DE (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/866,741

(22) Filed: May 30, 2001

(51) Int. Cl.⁷ .................................................. H03M 1/00
(52) U.S. Cl. ...................... 341/128; 341/118; 341/155; 341/120; 341/167; 341/136; 341/172; 341/166; 341/168
(58) Field of Search ................................ 341/118, 128, 341/155, 120, 167, 136, 172, 166, 168

(56) References Cited

U.S. PATENT DOCUMENTS

| | | | |
|---|---|---|---|
| 3,895,376 A | * 7/1975 | Uchida ........................ 341/128 |
| 4,357,600 A | 11/1982 | Ressmeyer et al. ......... 340/347 |
| 4,574,271 A | 3/1986 | Yada ........................... 340/347 |
| 4,857,933 A | 8/1989 | Knight ........................ 341/168 |
| 4,947,168 A | 8/1990 | Myers ......................... 341/120 |
| 5,012,247 A | 4/1991 | Dillman ...................... 341/172 |
| 5,117,227 A | 5/1992 | Goeke ......................... 341/166 |
| 5,235,333 A | * 8/1993 | Naylor et al. ............... 341/118 |
| 5,266,951 A | 11/1993 | Kuegler et al. ............. 341/120 |
| 5,321,403 A | 6/1994 | Eng, Jr. et al. ............. 341/168 |
| 5,361,067 A | 11/1994 | Pinckley ..................... 341/120 |
| 5,448,239 A | 9/1995 | Blumberg et al. .......... 341/166 |
| 5,499,027 A | 3/1996 | Karanicolas et al. ....... 341/120 |
| 5,500,644 A | 3/1996 | Denjean et al. ............. 341/120 |
| 5,592,168 A | 1/1997 | Liao ............................ 341/167 |
| 5,621,406 A | 4/1997 | Goetzinger et al. ......... 341/120 |
| 5,644,308 A | 7/1997 | Kerth et al. ................. 341/120 |
| 5,668,551 A | 9/1997 | Garavan et al. ............ 341/120 |
| 5,745,060 A | 4/1998 | McCartney et al. ........ 341/120 |
| 5,771,012 A | 6/1998 | Shu et al. .................... 341/118 |
| 6,057,891 A | 5/2000 | Guerin et al. ............... 348/572 |
| 6,127,955 A | 10/2000 | Handel et al. .............. 341/120 |
| 6,140,948 A | 10/2000 | Yu .............................. 341/118 |
| 6,166,670 A | 12/2000 | O'Shaughnessy ........... 341/136 |
| 6,198,423 B1 | 3/2001 | Yu .............................. 341/172 |

OTHER PUBLICATIONS

"Digital Processing in an Analog World," by David Tweed, Mar. 19–23, 2001, pp. 1, 7, and 8.
"Pipeline ADCs Come of Age," www.dbserv.maxim–ic–.com, pp. 1–5.
"18–Bit ADC with Serial Interface," Maxim, pp. 6, 7, 13, and 14.

* cited by examiner

*Primary Examiner*—Michael Tokar
*Assistant Examiner*—Lam T. Mai

(57) ABSTRACT

A multislope, continuously integrating analog-to-digital converter includes a first switch coupled to a first reference voltage, a second switch coupled to a second reference voltage, a third switch coupled to an input voltage, and an integrator operably coupled to the first, second, and third switches. The analog-to-digital converter utilizes a primary discharge current of opposite polarity to a secondary discharge current. The analog-to-digital converter has a high resolution due to a small reference voltage, and a high dynamic range due to a large reference voltage. The analog-to-digital converter can operate in either a conversion mode or a calibration mode. During the calibration mode, a calibration factor is calculated for use during the conversion mode. When applied to the conversion mode, the calibration factor corrects for errors in the conversion process.

14 Claims, 8 Drawing Sheets

ANALOG-TO-DIGITAL CONVERTER

FIELD OF THE INVENTION

The present invention relates to the field of analog-to-digital converters. More specifically, the present invention relates to multislope, continuously integrating analog-to-digital converters.

BACKGROUND OF THE INVENTION

Analog-to-digital (A/D) converters are known. One conventional type of A/D converter is the dual slope integrating converter. Dual slope converters are switched between an input voltage and a reference voltage at controlled times. The value of the input voltage is determined from the time required to discharge the integrator to zero voltage with the reference voltage. Dual slope converters require intermittent switching, which results in aliasing of noise components into the converter's signal band. Also, quantization errors, like other noise, accumulate over repeated conversion cycles.

Multislope A/D converters are similar to dual slope converters, with the exception that reference voltages of varying magnitudes are applied to decrease measurement time, without decreasing resolution. The stability of multislope converters, however, is dependent upon the absence of an input signal during the run-down period. Also, the resolution for a multislope converter is limited by total signal input energy.

A third type of conventional A/D converter is the continuously integrating A/D converter. A continuously integrating converter maintains the input signal switched to an integrator. This configuration results in less noise. However, a disadvantage is that resolution is limited by bandwidth requirements for conversion of high speed signals.

The conventional A/D converters discussed above accumulate errors during use. For example, the precision of the components such as resistors, capacitors, etc. varies, which can lead to errors in the conversion process. These types of errors are typically corrected by calibration. However, conventional calibration requires control logics dedicated to the calibration process, which increases the cost of conventional A/D converters. Also, conventional calibration does not adequately compensate for errors as they occur during operation of A/D converters.

Therefore, a need exists for an analog-to-digital converter having a high resolution over a wide dynamic range, with low noise effects. A further need exists for an analog-to-digital converter that can be calibrated without adding undue cost.

SUMMARY OF THE INVENTION

The present invention satisfies the above needs and achieves other advantages not present in conventional devices.

According to a first aspect of the invention, an analog-to-digital converter comprises a first switch coupled to a first large reference voltage, a second switch coupled to a second small reference voltage, a third switch coupled to an input voltage, an integrator operably coupled to the first, second, and third switches, a comparator coupled to the integrator, and control logic coupled to the first, second, and third switches. The second reference voltage has a polarity opposite to the first reference voltage.

According to the first aspect, the resolution of the analog-to-digital converter can be increased according to the second, smaller, reference voltage, and the dynamic range can be increased according to the first, larger, reference voltage. In addition, the use of reference voltages of opposite polarity eliminates the need for an offset of the input voltage to maintain an input signal of constant polarity.

According to a second aspect of the invention, the analog-to-digital converter is operable in either an analog-to-digital conversion mode, or a calibration mode. During a calibration process, a calibration factor is calculated for application during a conversion process. When applied to the conversion process, the calibration factor corrects for errors in the conversion process.

According to the second aspect, the calibration mode is similar in operation to the conversion mode. Therefore, the calibration factor accurately reflects the errors that occur during the conversion process. In addition, control of the conversion and calibration processes is simplified.

Other aspects and advantages of aspects of the invention will be discussed with reference to the drawings figures and to the detailed description of the preferred embodiments.

DETAILED DESCRIPTION OF PREFERRED EMBODIMENTS

An analog-to-digital converter and a method of operating an analog-to-digital converter according to the present invention will be described below by way of preferred embodiments and with reference to the accompanying drawings.

Figure 1:
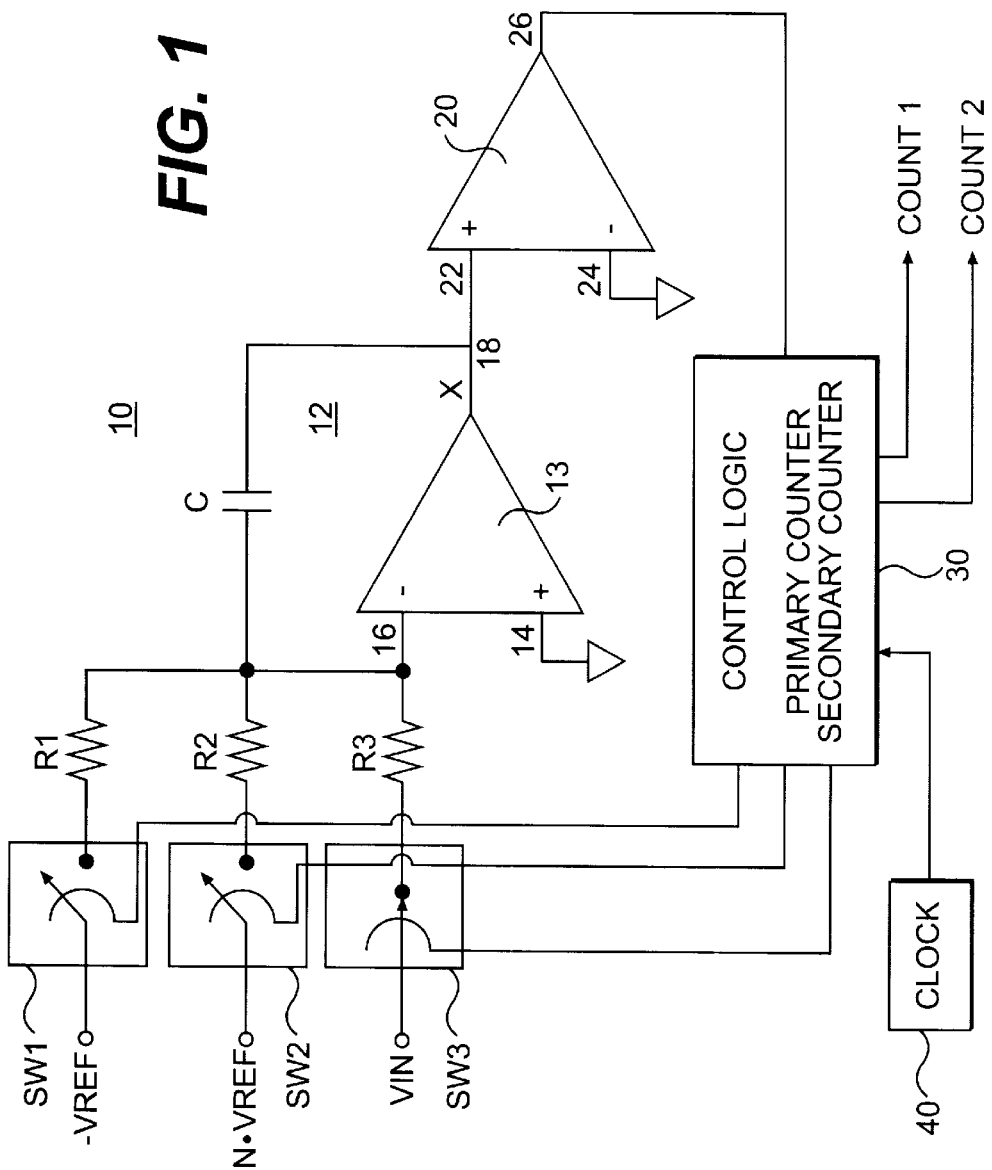
FIG. 1 is a schematic diagram of an analog-to-digital converter according to an embodiment of the present invention.

FIG. 1 illustrates an analog-to-digital (A/D) converter 10 according to an embodiment of the present invention. The analog-to-digital converter 10 is a continuously integrating, multislope A/D converter. The A/D converter 10 includes an integrator 12 which is comprised of an operational amplifier 13 and an integration capacitor C. The operational amplifier 13 has a non-inverting input 14, an inverting input 16, and an output 18. The inverting input 16 is coupled to a small reference voltage−VREF through a resistor R1 and a switch SW1, and coupled to a large reference voltage N·VREF through a resistor R2 and a switch SW2. The input voltage VIN is coupled to the input 16 through a resistor R3 and a switch SW3. The non-inverting input 14 is coupled to ground, and the output 18 is coupled to a non-inverting input 22 of a comparator 20. An inverting input 24 of the comparator 20 is coupled to ground, and an output 26 of the comparator 20 is coupled to a control logic 30.

The control logic 30 is coupled to the switches SW1, SW2, SW3, and controls the opening and closing of the switches SW1, SW2, SW3. A clock 40 is coupled to the control logic 30 to provide a time base to the control logic 30.

The control logic 30 includes primary and secondary counters. The outputs of the primary and secondary counters are coupled to a processor (not illustrated) of the A/D converter 10. The processor may be, for example, a central processing unit, a microprocessor, or other processing unit. The processor uses the count 1 and count 2 values for A/D conversion of the input voltage VIN, and to perform calibration functions for the A/D converter 10. The processor does not need to be dedicated to the A/D converter 10.

Figure 2:
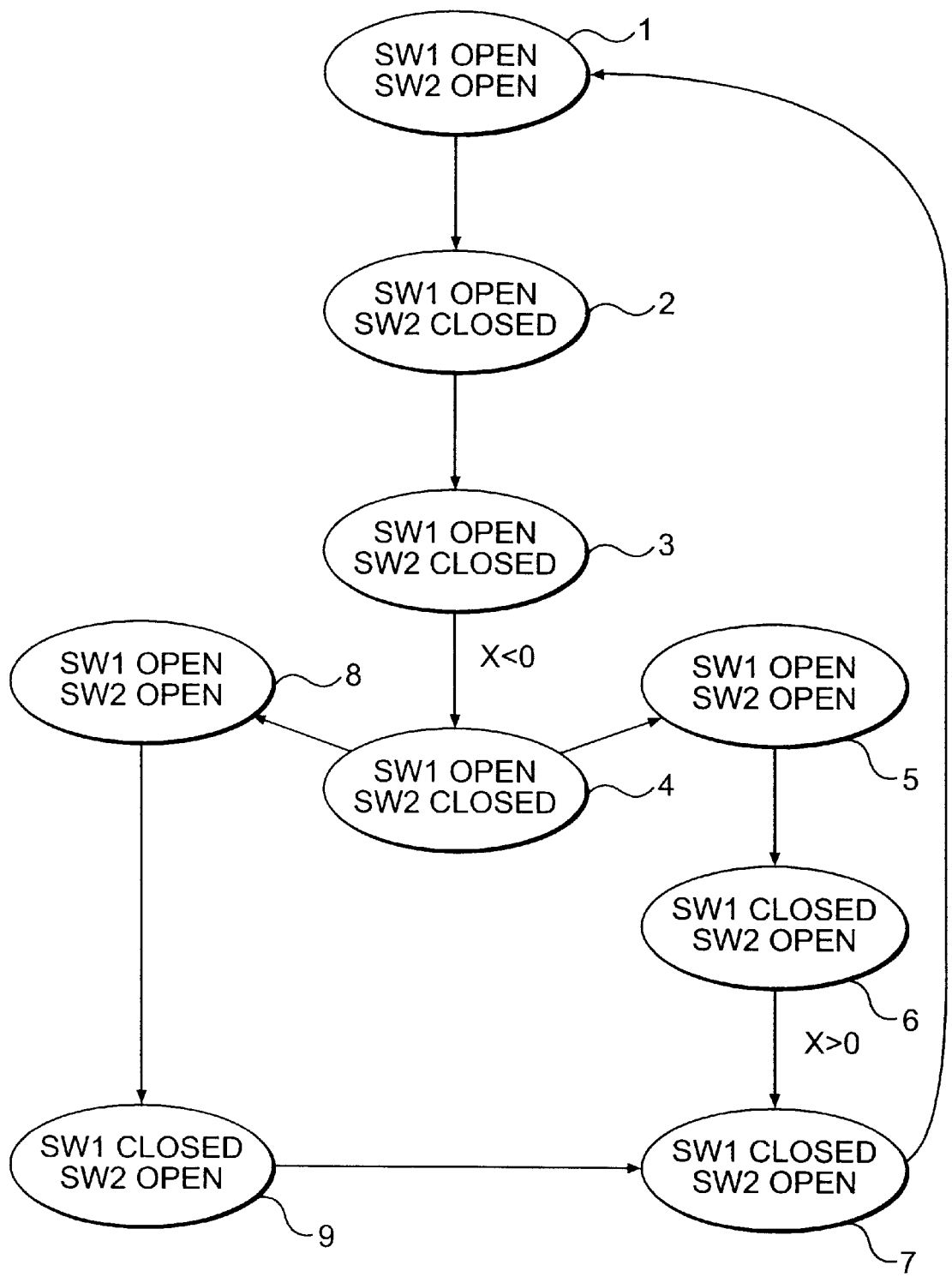
FIG. 2 is a state diagram for the A/D converter of FIG. 1.

The A/D converter 10 is operable in two modes: a conversion mode and a calibration mode. FIG. 2 illustrates a state diagram for the A/D converter 10 for both the conversion mode and the calibration mode. In the conversion mode, the A/D converter 10 converts an unknown analog input signal VIN into a digital output signal. In the calibration mode, the A/D converter 10 determines a calibration factor α to be applied during the conversion process to compensate for errors in the conversion process. The conversion process and the calibration process are synchronous, and both processes repeat over a fixed number of counts. In the exemplary embodiments discussed below, the conversion process and the calibration process repeat over a cycle of 2048 counts, although a greater or fewer number of counts can be used.

As illustrated by the state diagram FIG. 2, the conversion mode and the calibration mode of operating the A/D converter 10 are similar in operation, and the two modes can be carried out using similar logic. In a conversion cycle, the A/D converter 10 proceeds through states 1–7, and returns to state 1 to begin a new conversion cycle. In a calibration cycle, the A/D converter 10 proceeds through states 1–4, 8, 9, 7, and returns to state 1 to begin a new calibration cycle. The primary difference between the conversion mode and the calibration mode is that the switch SW3 remains closed in the conversion mode, and open in the calibration mode.

The conversion process may be performed during specified periods, during which periods the A/D converter 10 performs its primary function of converting analog signals into digital signals over a series of conversion cycles. The A/D converter 10 can be programmed to operate in the calibration mode for selected intervals between periods of conversion. In the calibration mode, the A/D converter 10 executes a number of calibration cycles, and generates the calibration factor α. After the calibration process is complete, the A/D converter 10 reverts to the conversion mode, and utilizes the calibration factor α from the calibration process. The conversion mode and the calibration mode are each discussed in detail below.

Figure 3:
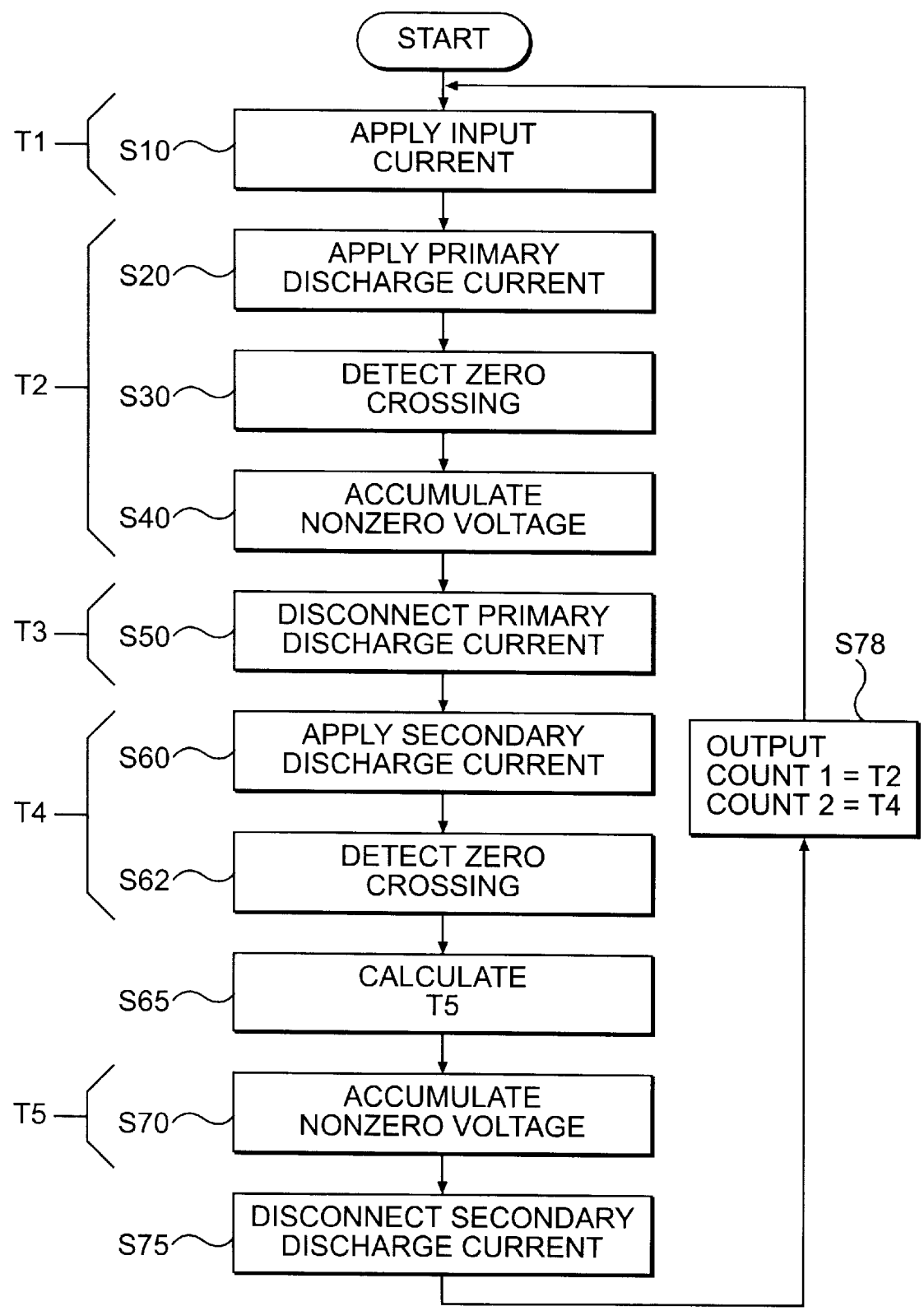
FIG. 3 illustrates a method of operating the A/D converter of FIG. 1 in a conversion mode.
Figure 4:
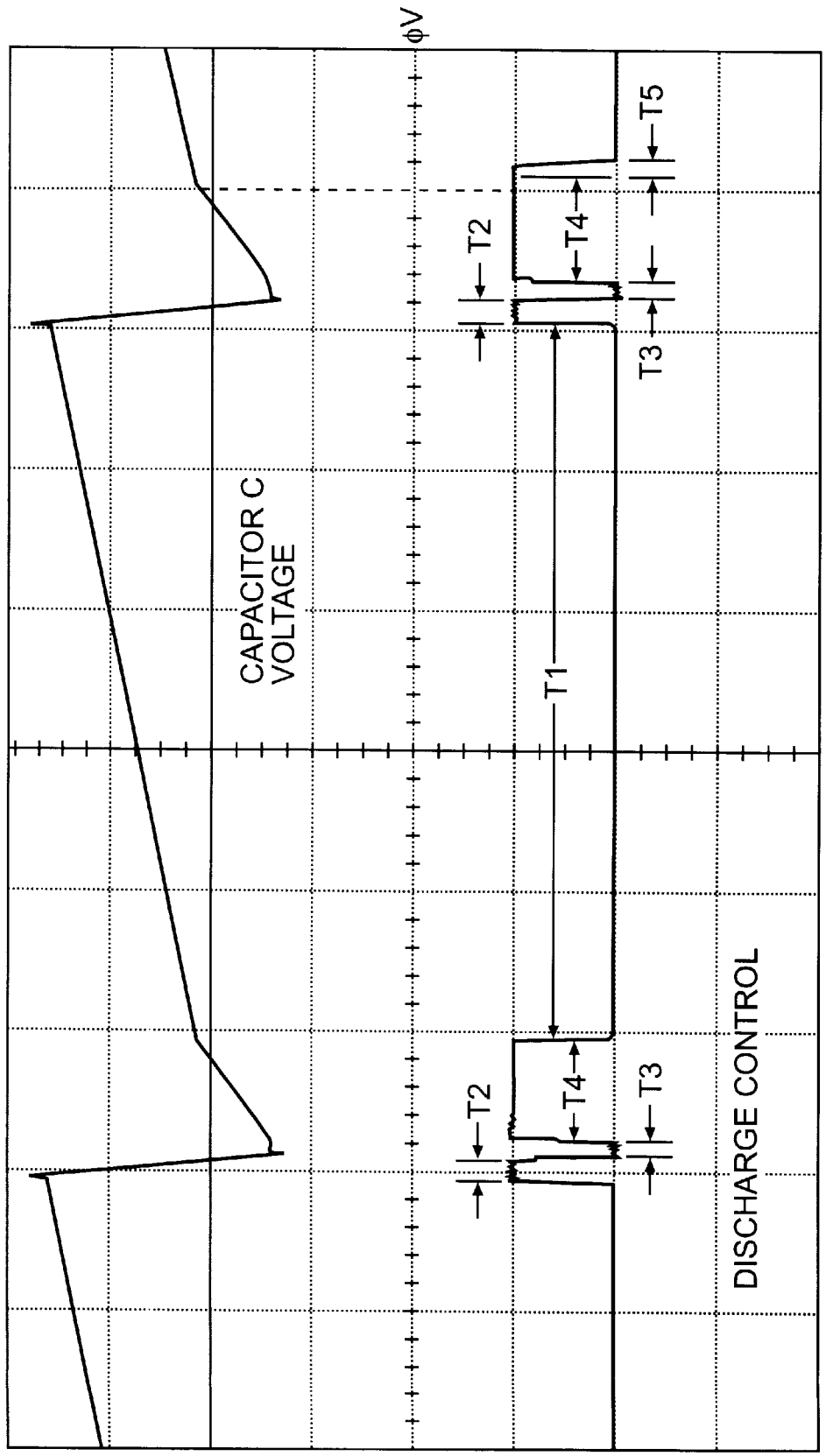
FIG. 4 illustrates the voltage on an integration capacitor and a discharge control in the conversion mode.

The conversion mode of the A/D converter 10 will now be discussed with reference to FIGS. 2–4. FIG. 3 is a flow chart illustrating a method of operating the A/D converter 10 in the conversion mode, and FIG. 4 illustrates voltage on the integration capacitor C, and a discharge control, during the conversion process. The conversion process comprises a series of conversion cycles, each conversion cycle being represented by the closed conversion loop in FIG. 2 (states 1–7, 1). Each conversion cycle can last, for example, 2048 counts. Depending upon the degree of resolution desired, and upon the components used in the A/D converter 10, the number of counts can be increased or decreased.

Referring to FIGS. 2–4, the conversion process begins at step S10 by closing the switch SW3, which results in the application of an input current VIN/R3 to the integrator 12. The controller 30 maintains the application of the input current VIN/R3 throughout the conversion process. Step S10 begins state 1. In state 1, the switches SW1 and SW2 are open, and no reference currents are applied to the integrator 12. The A/D converter 10 is maintained in state 1 for a time T1, during which time the charge on the integration capacitor C increases due to the application of the input current VIN/R3. The increase in voltage on the integration capacitor C over time T1 is illustrated by FIG. 4.

In step S20, the switch SW2 is closed, and a primary discharge current N·VREF/R2 is applied to the inverting input 16 for a time T2. Time T2 is the primary discharge period for the integrator 12, and states 2–4 all occur during time T2. During time T2, the switch SW3 remains closed, and the combination of the input current VIN/R3 and the primary discharge current N·VREF/R2 discharges the integration capacitor C through ground. FIG. 4 illustrates the drop in voltage on the integration capacitor C during T2.

The magnitude of the charge of the integration capacitor C is decreased until an output signal X (see FIG. 1) from the operational amplifier 13 crosses zero, as detected by the comparator 20 in step S30. The zero crossing corresponds to state 3.

After the integration capacitor C voltage crosses zero, the SW2 remains closed, and a nonzero voltage accumulates on the integration capacitor C in step S40. The accumulation of charge on the integration capacitor C corresponds to state 4, which occurs at the end of the primary discharge period T2. The switch SW2 is maintained closed for a small, fixed time after the zero crossing, which may be on the order of, for example, 1–5% of the total conversion cycle time. The primary counter 30 determines time T2 as count 1 in FIG. 1. The time T2 is the amount of time elapsed between step S20 and S30, plus the fixed time amount of time that the primary discharge current is applied after the zero crossing.

In step S50, the control logic 30 opens the switch SW2 for a time T3, disconnecting the primary discharge current from the integrator 12. The switch SW3 remains closed. The time T3, during which time the AJD converter 10 is in state 5, allows transients arising from current switching to die away. The time T3 may be a relatively short time, on the order of, for example, 5% of the total conversion cycle time.

In step S60, the switch SW1 is closed for a time period of T4+T5, while a secondary discharge current −VREF/R1 is applied to the integrator 12 through the resistor R1. The time T4+T5 corresponds to the secondary discharge period, or states 6 and 7. During the secondary discharge period, a secondary discharge current of −VREF/R1 is applied to the integrator 12. The integrator 12 is discharged more slowly in the secondary discharge period than in the primary discharge period, because the secondary discharge current is smaller than the primary discharge current. For example, if N=4, the primary discharge current would be 4·VREF/R2. The resistance of R2 can be selected so that it is smaller than R1, for example, by a factor of 4. Therefore, in this example, the primary discharge current would be 16 times as great in magnitude as the secondary discharge current. The ratio of primary to secondary discharge current can be referred to generally as λ.

The A/D converter 10 remains in state 6 until the comparator 20 detects a zero crossing of signal X in step S62. The time required for the integration capacitor C charge to cross zero after applying the secondary discharge current is T4. The secondary counter determines time T4 as count 2. Because the secondary discharge rate is $\frac{1}{16}^{th}$ of the primary discharge rate, the voltage change per count of the secondary counter is of 16 times finer resolution than the primary counter during the primary discharge period.

In step S65, the processor calculates a time T5. After the zero crossing, in step S70, the switch SW1 remains closed for the time T5, and a nonzero voltage accumulates on the integration capacitor C during the time T5. The time T5 corresponds to state 7. State 7 serves the dual purpose of allowing a nonzero voltage to accumulate on the integration capacitor C after the zero crossing, and of providing a window to apply a correction time to the conversion process. The time T5 includes a fixed time period m, and a variable correction time Δ.

The correction time Δ is advantageous because errors in the VIN measurement may be introduced by mismatches in the primary and secondary discharge currents. Ideally, the discharge currents have a constant ratio of $\lambda = -N \cdot R2/R1$. In the exemplary embodiment discussed above, the ideal constant ratio $\lambda = -16$. Errors arise from mismatches in the discharge currents that occur due to the limits of resolution of the resistors R1, R2, and other components in the A/D converter 10. Because the A/D processor assumes the ideal ratio λ when making the conversion calculation for VIN, failure to compensate for errors during conversion can result in periodic nonlinearities in the conversion process. According to the present invention, mismatches in the primary and secondary discharge currents are compensated for by adding the variable correction time Δ to the fixed time m. The correction time Δ is calculated using the calibration factor a calculated in the calibration process. The calculation of the calibration factor α will be discussed later with reference to FIGS. 5 and 6. The application of the correction time Δ to the conversion process in order to calculate T5 is discussed below.

After the comparator 20 detects a zero crossing of the signal X at state 6, the integration capacitor C continues to discharge in state 7. The time that the A/D converter remains in state 7 is:

$$T5 = m + \Delta.$$

The correction time Δ can be positive or negative. The value m is a nonzero value chosen to be greater than Δ, ensuring that T5 is positive. The correction time Δ is calculated according to the following general formula:

$$\Delta = T4 \cdot \alpha.$$

The calculation of T5 is performed for each conversion cycle.

The calculation of the correction time Δ may be based on the immediately preceding time T4, or, it may be based on an average of T4 values from a selected number of previous conversion cycles. In the latter case, the correction time would be calculated as:

$$\Delta = T4_{avg} \cdot \alpha.$$

When using an average T4 value, the correction time Δ lags in the conversion process by one or more cycles.

If the correction time Δ includes a fractional value of a clock cycle, the fractional values can be carried over into a subsequent conversion cycles using first order sigma-delta modulation or second order sigma-delta modulation.

The counts 1 (T2) and 2 (T4) measured during the primary and secondary discharge periods are output to the processor in step S78. The counts 1 and 2 are used to convert VIN into digital format in the processor. VIN is calculated by combining the times T2 and T4, each time being weighted by the amplitude of its discharge current. In weighting T2 and T4, T4 is divided by the ideal ratio λ, or, T2 is multiplied by ideal ratio λ. The processor also applies post-conversion digital filtering, and other post-conversion signal processing.

According to the above-described conversion process, the overall resolution of the A/D converter 10 is determined by the smaller, secondary discharge current $-VREF/R2$, which meters smaller quanta of charge in the integrator 12. The dynamic range of the A/D converter 10 is determined by the larger, primary discharge current $N \cdot VREF/R1$, which determines the maximum negative voltage that can be applied to the A/D converter while maintaining linear behavior of the integrator 12. The A/D converter 10 therefore achieves high resolution conversion of VIN, over a wide dynamic range, with low noise.

The above embodiment is described in the context of an ideal ratio of $\lambda = -16$. Other ratios, however, may achieve similar advantages. When choosing a ratio λ, it is preferable to use a binary number because the conversion operation can use binary shifts when multiplying by λ.

The above-described embodiment discloses reference voltages $-VREF$ and $N \cdot VREF$ of opposite polarity. This feature provides flexibility to the control of the A/D converter 10 because the reference signals of opposite polarity can be used to balance the input signal VIN on either side of ground. Reference signals of opposite polarity also allow for continuous measurement of integration capacitor C charge from one side of ground, across ground, to the other side of ground. The A/D converter 10 therefore does not change its measurement characteristics in the vicinity of ground.

Figure 5:
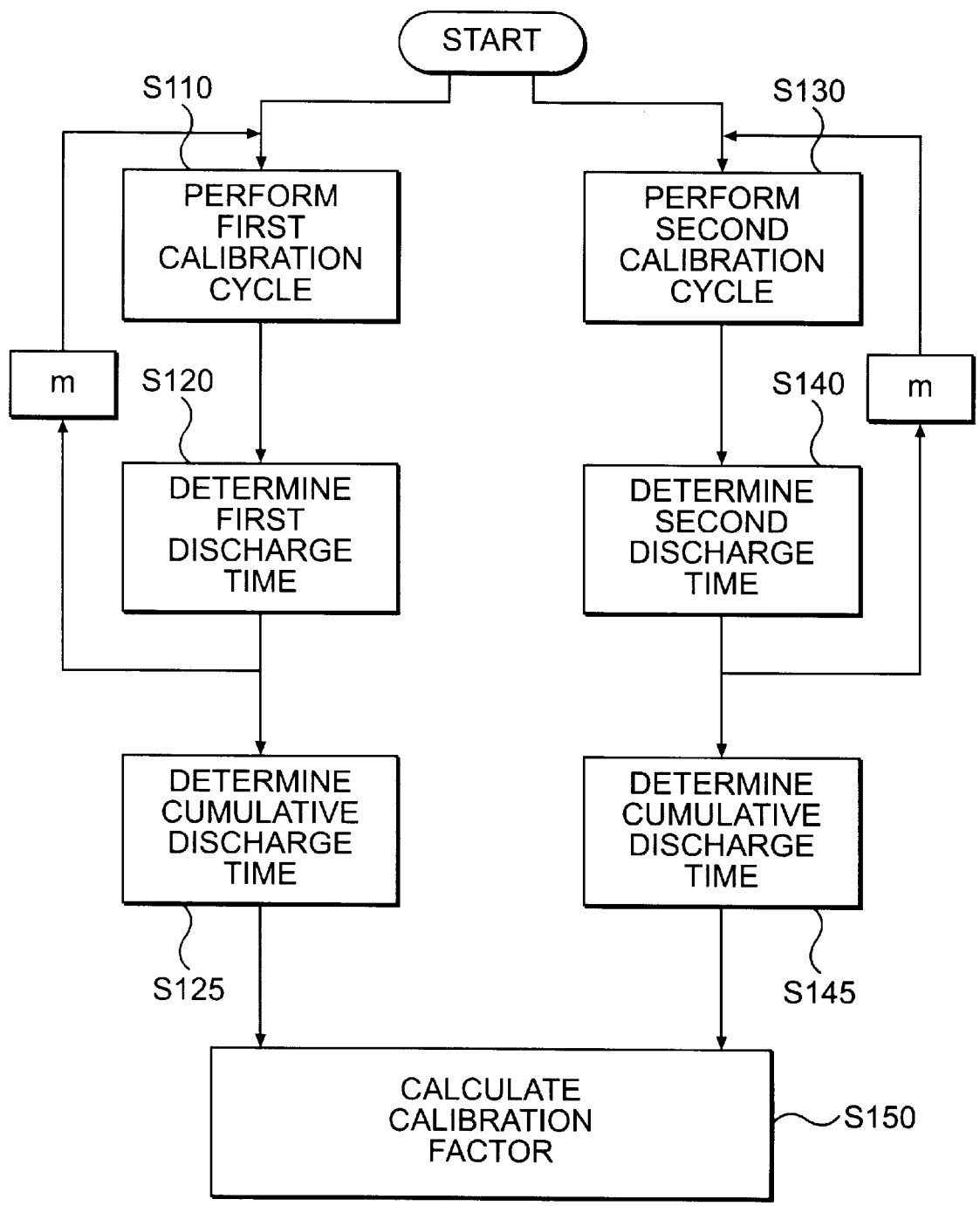
FIG. 5 illustrates a method of operating the A/D converter in a calibration mode.
Figure 6:
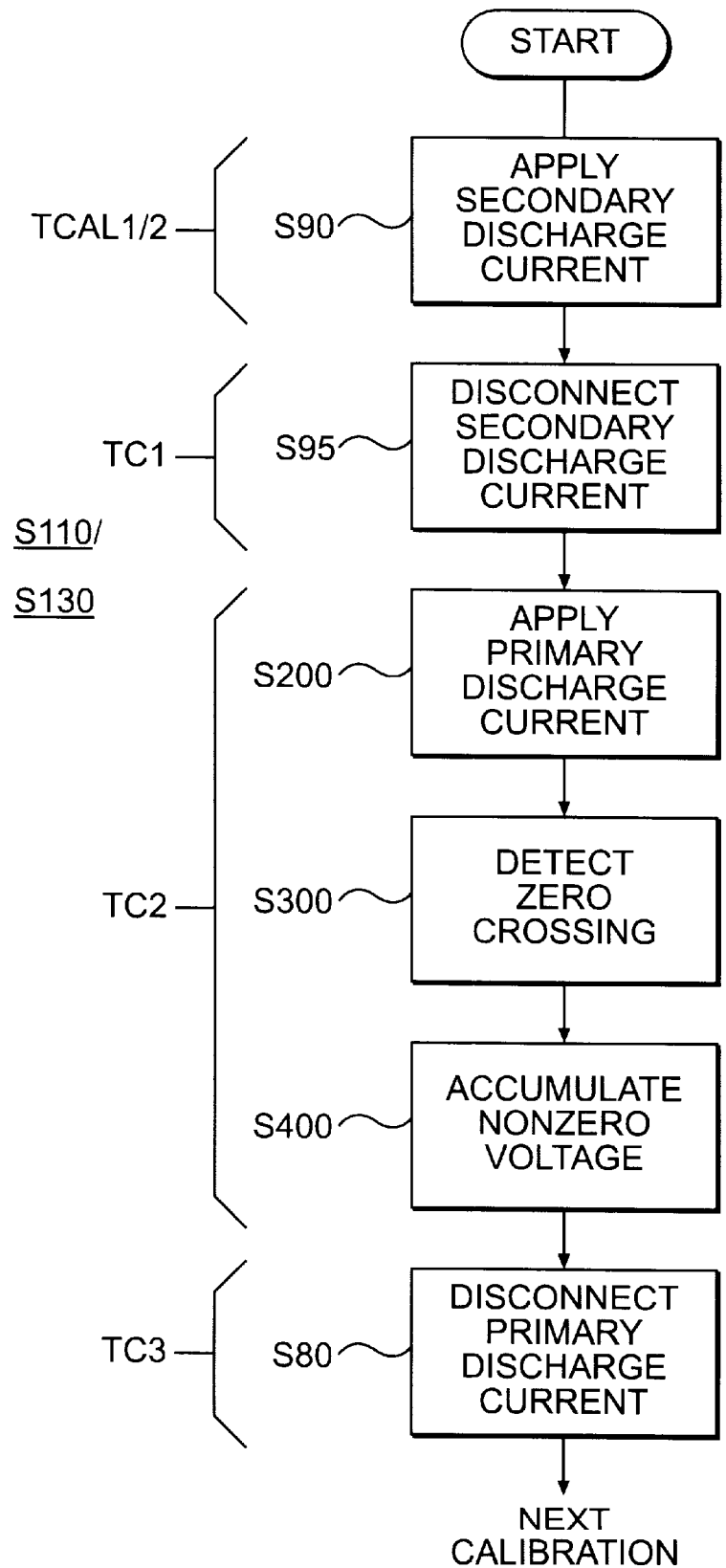
FIG. 6 illustrates a method of operating the A/D converter in a first and a second calibration cycle.
Figure 7:
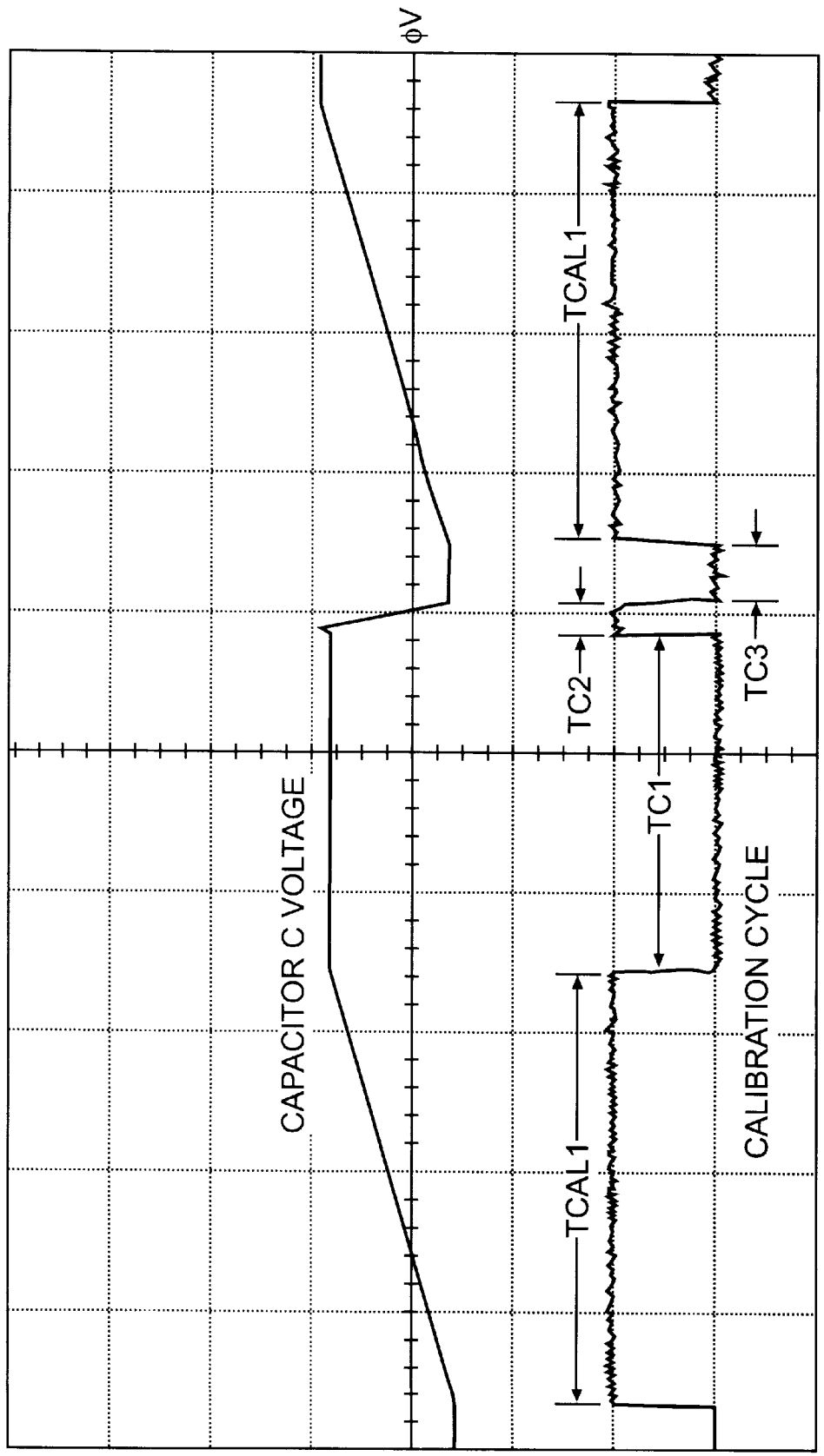
FIG. 7 illustrates the voltage on an integration capacitor and a discharge control in the first calibration cycle.
Figure 8:
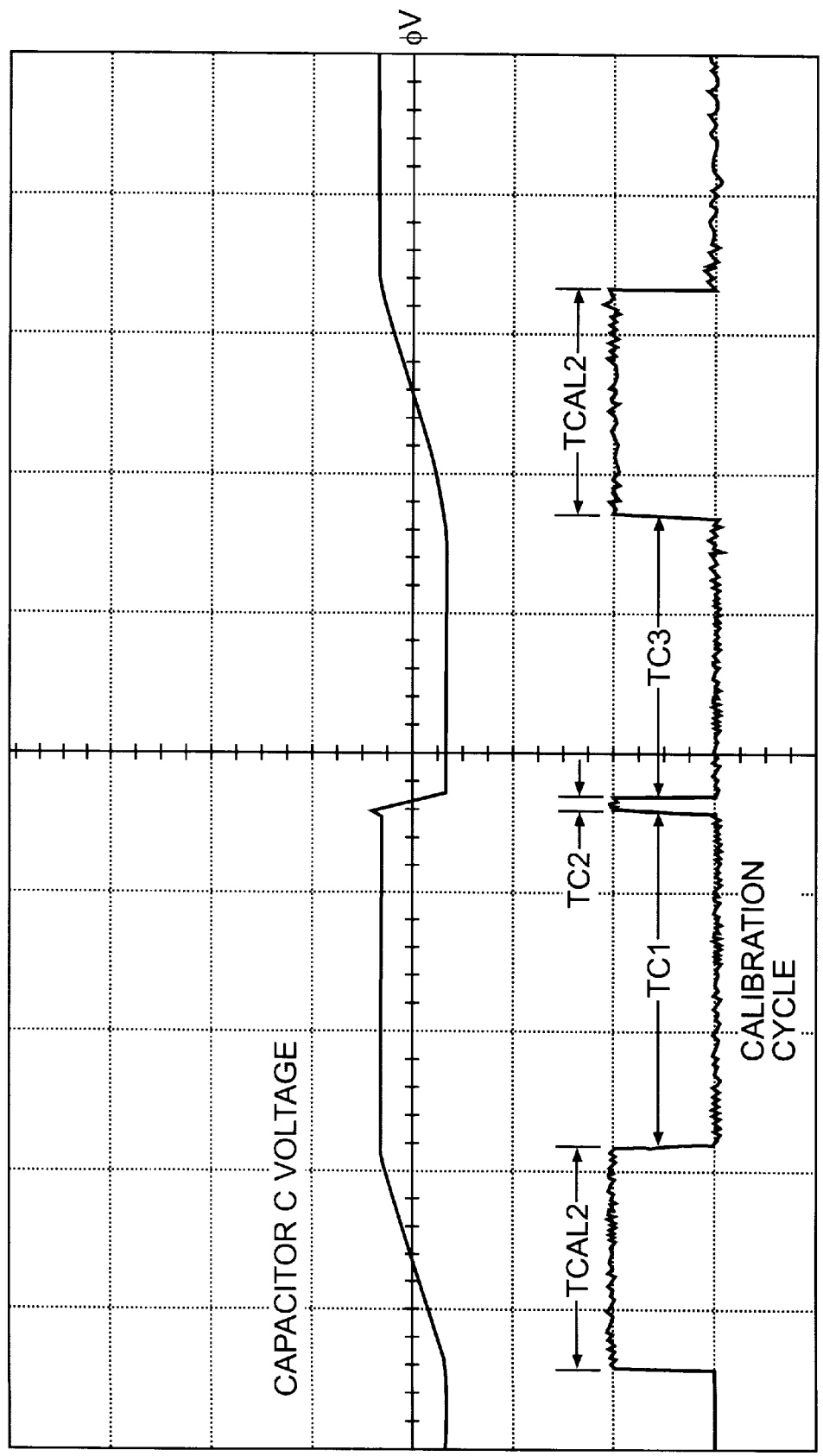
FIG. 8 illustrates the voltage on an integration capacitor and a discharge control in the second calibration cycle.

The calibration factor α used in the conversion mode is calculated during a calibration process while the analog-to-digital converter 10 is in the calibration mode. The calibration mode and process of the A/D converter 10 will now be discussed with reference to FIGS. 2 and 5–8. FIG. 5 illustrates a method of operating the A/D converter 10 in the calibration mode. FIG. 6 illustrates the first and second calibration cycles of the calibration process. FIG. 7 illustrates voltage on the integration capacitor C during the first calibration cycle, and FIG. 8 illustrates voltage on the integration capacitor C during the second calibration cycle. The electrical behavior of the A/D converter 10 during calibration is similar to conversion, except that SW3 remains open during calibration.

Calibration processes can be performed, for example, at predetermined intervals between conversion processes. Calibration can be performed more frequently if a higher degree of accuracy is desired for conversion processes, or in response to a change in environment, such as a change in temperature, or with increasing age of components within the A/D converter 10. A calibration process consists of performing a first calibration cycle for m iterations, and then performing a second calibration cycle for m iterations, and comparing discharge times from the first and second cycles in order to calculate a calibration factor α. The calibration factor a is calculated according to the following formula:

$$a = k1 \cdot \left(1 - \frac{|\lambda|}{m} \cdot \frac{TC2_1 - TC2_2}{TCAL1 - TCAL2}\right)$$

where:
  λ=ideal ratio of primary discharge current to secondary discharge current
  $TC2_1$=discharge value from the m first calibration cycles
  $TC2_2$=discharge value from the m second calibration cycles TCAL1=known calibration time for the first calibration cycles TCAL2=known calibration time for the second calibration cycles k1=a constant, if necessary, due to scaling in implementation m=the number or iterations that the first and second calibration cycles are performed in the calibration process.

The discharge values $TC2_1$, $TC2_2$, are determined by performing the first and second calibration cycles, respectively. TCAL1 and TCAL2 are known values.

The calibration process will be discussed with reference to FIGS. 2 and 5. Prior to calibration, the switch SW3 is opened, and remains open throughout calibration. The first calibration cycle is performed in step S110. A first discharge time TC2 is determined in step S120 for the current iteration of the first calibration cycle (the first calibration cycle is discussed in detail with reference to FIG. 6). Steps S110 and S120 are performed m times. After m first discharge times TC2 are determined, the first discharge value $TC2_1$ is determined in step S125. The first discharge value $TC2_1$ can be calculated as a sum of the m first discharge times TC2 from the m first calibration cycles, e.g., as a "cumulative" discharge time. The value m can be any positive integer, including one.

After the m first calibration cycles are completed, the A/D converter 10 switches to execution of m second calibration cycles. In step S130, a second calibration cycle is performed. In step S140, a second discharge time TC2 is determined for each second calibration cycle. After m iterations of steps S130 and S140, the m values of second discharge time TC2 are used to determine a second discharge value $TC2_2$ in step S145. The second discharge value $TC2_2$ may also be a cumulative discharge time for the m second calibration cycles.

In step S150, the calibration factor a is calculated using the formula:

$$a = k1 \cdot \left(1 - \frac{|\lambda|}{m} \cdot \frac{TC2_1 - TC2_2}{TCAL1 - TCAL2}\right).$$

The first and second calibration cycles will now be discussed in detail with reference to FIGS. 2 and 5–7.

An iteration of the first calibration cycle, corresponding to step S110 in FIG. 5, is illustrated in FIG. 6. The first calibration cycle begins in state 8, with the switches SW1, SW2 and SW3 open. The switches SW1, SW2 remain open for a time TC3. In step S90, the switch SW1 is closed for the first known calibration time TCAL1. The first known calibration time TCAL1 can be, for example, 1000 counts. As shown in FIG. 6, the application of the secondary discharge current −VREF/R1 causes the integration capacitor C voltage to cross zero during TCAL1. The time TCAL1 corresponds to states 9 and 7. It is not necessary to measure a zero crossing at state 7.

The switch SW1 is opened in step S95, disconnecting the secondary discharge current from the integrator 12 for a time TC1. This corresponds to state 1 in FIG. 2.

In step S200, the switch SW2 is closed, and the primary discharge current is applied to the inverting input 16. The primary discharge current of N·VREF/R2 then discharges the integration capacitor C through ground, until the signal X crosses zero. The zero crossing (state 3) is detected in step S300. The zero crossing is illustrated in FIG. 7. In step S400, the switch 1 remains closed for a known time to accumulate a nonzero charge on the integration capacitor C, corresponding to state 4 in FIG. 2. In step S80, the control logic 30 opens the switch SW2, restoring the A/D converter 10 to state 8. The processor of the A/D converter 10 determines TC2 as the time required for the capacitor C voltage to cross zero after applying the primary discharge current, plus the known time in step S400. TC2 is the discharge time for the first calibration cycle.

After the first iteration of the first calibration cycle is complete, the A/D converter 10 performs the first calibration cycle repeatedly for m cycles. The m first discharge times TC2 from the m first calibration cycles are used to determine the cumulative, first discharge value $TC2_1$ in step S125 (FIG. 5).

After performing m first calibration cycles, m second calibration cycles are performed. The second calibration cycles are also performed using the steps illustrated by FIG. 6, each second calibration cycle illustrated by FIG. 6 corresponding to an iteration of step S130 in FIG. 5. From each of the m second calibration cycles, a second discharge time TC2 is determined (step S140 of FIG. 5). From the m second discharge times TC2, the cumulative, second discharge value $TC2_2$ for the m second calibration cycles is determined.

As shown in FIG. 8, the m second calibration cycles are performed with a calibration time TCAL2 that it is shorter than TCAL1.

The first and second discharge values $TC2_1$, $TC2_2$ are used to calculate the calibration factor α as discussed above with reference to FIG. 5. When the calibration process has been completed, and the calibration factor a calculated, the A/D converter 10 reverts to the conversion mode. In the conversion mode, the A/D converter 10 utilizes the calibration factor α for calculation of the correction time Δ.

While the present invention is described with reference to exemplary embodiments, it will be understood that many modifications will be readily apparent to those skilled in the art, and the present disclosure is intended to cover variations thereof.

What is claimed is:

1. An analog-to-digital converter, comprising:
    a first switch coupled to a first reference voltage;
    a second switch coupled to a second reference voltage, the second reference voltage having a magnitude greater than the first reference voltage and a polarity opposite to the first reference voltage;
    a third switch coupled to an input voltage;
    an integrator coupled to the first, second, and third switches;
    a comparator having an input coupled to the integrator and an output; and
    control logic coupled to the output of the comparator and to the first, second, and third switches, wherein the control logic controls opening and closing of the first, second, and third switches, and wherein
    the analog-to-digital converter is operable in a conversion mode during which analog signals are converted to digital signals, the third switch remaining closed during the conversion mode.

2. The analog-to-digital converter of claim 1, comprising:
    a first resistor disposed between the first reference voltage and the integrator; and
    a second resistor disposed between the second reference voltage and the integrator, the first resistor having a higher resistance than that of the second resistor.

3. The analog-to-digital converter of claim 1, wherein the analog-to-digital converter is operable in a calibration mode during which a calibration factor is generated, the third switch remaining open during the calibration mode.

4. The analog-to-digital converter of claim 1, wherein the control logic varies a time that the first switch remains closed as a function of a calibration factor in order to compensate for errors in a conversion process.

5. The analog-to-digital converter of claim 4, wherein the control logic varies the time that the first switch remains open according to a correction time, wherein the correction time is calculated as a function of the calibration factor and the time required for a zero crossing of an output signal of the integrator.

6. The analog-to-digital converter of claim 5, wherein the control logic calculates the correction time as a function of an average of a plurality of zero crossing times of the output signal of the integrator, wherein the plurality of zero crossing times are determined over a plurality of conversion cycles.

7. A method of operating an analog-to-digital converter, comprising:

applying an input current to an integrator;

applying a primary discharge current to the integrator;

detecting a first zero crossing while the primary discharge current is applied to the integrator;

disconnecting the primary discharge current from the integrator;

determining a first count based upon the time elapsed for the first zero crossing;

applying a secondary discharge current to the integrator for a second time, the secondary discharge current having a magnitude greater than the magnitude of the primary discharge current, and a polarity opposite to that of the primary discharge current;

detecting a second zero crossing while the secondary discharge current is applied to the integrator;

disconnecting the secondary discharge current from the integrator;

determining a second count based on the time elapsed for the second zero crossing; and outputting the first and second counts.

8. The method of claim 7, comprising:

calculating a correction time as a function of a calibration factor.

9. The method of claim 8, comprising:

continuing to apply the secondary discharge current to the integrator after the second zero crossing for a known period of time plus the correction time.

10. The method of claim 8, wherein the step of calculating a correction time includes:

multiplying the time elapsed for the second zero crossing by the calibration factor.

11. The method of claim 8, wherein the step of calculating a correction time includes:

calculating an average zero crossing time for a plurality of conversion cycles.

12. The method of claim 7, comprising:

continuing to apply the input current to the integrator through the first and second zero crossings.

13. The method of claim 7, comprising:

disconnecting the input current from the integrator; and operating the analog-to-digital converter in a calibration mode, the calibration mode comprising the step of:
determining the calibration factor.

14. The method of claim 7, wherein the primary discharge current is sixteen times greater in magnitude than the secondary discharge current.

* * * * *